(12) United States Patent
Hanada

(10) Patent No.: US 8,131,057 B2
(45) Date of Patent: Mar. 6, 2012

(54) DEFECT DISTRIBUTION PATTERN COMPARISON METHOD AND SYSTEM

(75) Inventor: Yoshiyuki Hanada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 774 days.

(21) Appl. No.: 12/301,467

(22) PCT Filed: May 16, 2007

(86) PCT No.: PCT/JP2007/060047
§ 371 (c)(1),
(2), (4) Date: Nov. 19, 2008

(87) PCT Pub. No.: WO2007/135917
PCT Pub. Date: Nov. 29, 2007

(65) Prior Publication Data
US 2009/0316980 A1   Dec. 24, 2009

(30) Foreign Application Priority Data
May 19, 2006   (JP) .................................. 2006-140060

(51) Int. Cl.
*G06K 9/00* (2006.01)
*G06K 9/32* (2006.01)
*G01N 21/00* (2006.01)

(52) U.S. Cl. ...................... 382/145; 356/237.2; 382/294

(58) Field of Classification Search .......... 382/145–149, 382/224, 294; 356/237.1, 237.5
See application file for complete search history.

(56) References Cited

U.S. PATENT DOCUMENTS

| | | | |
|---|---|---|---|
| 5,479,252 A * | 12/1995 | Worster et al. ............. | 356/237.5 |
| 5,982,920 A * | 11/1999 | Tobin et al. .................. | 382/145 |
| 6,876,445 B2 * | 4/2005 | Shibuya et al. ............ | 356/237.2 |
| 7,084,968 B2 * | 8/2006 | Shibuya et al. ............ | 356/237.2 |
| 7,339,663 B2 * | 3/2008 | Lim et al. ................... | 356/237.5 |
| 7,391,510 B2 * | 6/2008 | Ben-Tulila et al. ........ | 356/237.1 |
| 7,433,508 B2 * | 10/2008 | Sakai et al. .................... | 382/144 |
| 7,471,919 B2 * | 12/2008 | Kawakami et al. ........... | 399/167 |
| 7,720,275 B2 * | 5/2010 | Shibuya et al. ............... | 382/149 |
| 7,889,909 B2 * | 2/2011 | Shindo et al. ................. | 382/145 |
| 7,949,178 B2 * | 5/2011 | Sakai et al. ................... | 382/144 |
| 2002/0076933 A1 | 6/2002 | Kawamura et al. | |

FOREIGN PATENT DOCUMENTS

| | | |
|---|---|---|
| JP | 11 231507 | 8/1999 |
| JP | 2002 184733 | 6/2002 |
| JP | 2003 329608 | 11/2003 |
| JP | 2005 236094 | 9/2005 |

\* cited by examiner

*Primary Examiner* — Andrae S Allison
(74) *Attorney, Agent, or Firm* — Oblon, Spivak, McClelland, Maier & Neustadt, L.L.P.

(57) ABSTRACT

A comparison system is provided with a defect inspection unit, a reference pattern storage unit, a pattern comparison unit, a comparison result processing unit and an output unit. The inspection unit inspects an object processed by a processing system, such as a semiconductor wafer, and obtains the distribution pattern of defects occurring on the surface of the object. The storage unit previously stores a reference pattern indicating a characteristic configuration of a specific portion of the processing system, which comes into contact with or approaches the object. The comparison unit compares the defect distribution pattern obtained by the defect inspection unit with the reference pattern stored in the storage unit. The comparison result processing unit obtains the degree of coincidence between the two patterns based on the comparison performed by the pattern comparison unit. The output unit outputs the obtained degree of coincidence to a display or the like.

8 Claims, 7 Drawing Sheets

FIG. 9

| REFERENCE PATTERN | DEGREE OF COINCIDENCE | POSSIBILITY DETERMINATION |
|---|---|---|
| ARRANGEMENT PATTERN OF GAS SPRAY HOLES 68B OF SHOWER HEAD 66B | 90 | NG |
| ARRANGEMENT PATTERN OF GAS SPRAY HOLES 68A OF SHOWER HEAD 66A | 60 | NG |
| ARRANGEMENT PATTERN OF GAS SPRAY HOLES 68C OF SHOWER HEAD 66C | 30 | OK |
| ARRANGEMENT PATTERN OF GAS SPRAY HOLES 68D OF SHOWER HEAD 66D | 20 | OK |
| ARRANGEMENT PATTERN OF PADS 17A OF ARM 16A | 5 | OK |
| ARRANGEMENT PATTERN OF PADS 17B OF ARM 16B | 5 | OK |
| ⋮ | ⋮ | ⋮ |

DEFECT DISTRIBUTION PATTERN COMPARISON METHOD AND SYSTEM

FIELD OF THE INVENTION

The present invention relates to a method and system for comparing the distribution pattern of defects (hereinafter referred to as a "defect distribution pattern") occurring on the surface of a target object, such as a semiconductor wafer, with a reference pattern indicating the characteristic configuration of a specific portion of a processing system, which comes into contact with or approaches the object.

BACKGROUND OF THE INVENTION

Generally, a desired semiconductor device, such as an integrated circuit (IC), is manufactured in such a way that various processing units are arranged in a processing system which constructs a manufacturing line, and various processes, such as a film forming process, an oxidation/diffusion process, an etching process, a modification process and an annealing process, are repeatedly performed on a semiconductor wafer (see, for example, Japanese Patent Laid-open Publication Nos. 10-223732, 2001-338969 and 2005-236094).

Meanwhile, the existence of defects, including the attachment of foreign materials, such as particles, is one of the major causes for the decreased yields of the semiconductor devices. Therefore, it is necessary to detect the excessive defects on a wafer over an allowable level in a short period of time to thereby suppress the decrease in yield to a minimum. Accordingly, the existence and distribution pattern of defects occurring on the surface of a wafer is appropriately measured in the manufacturing line. Further, when an operator who performs the measurement detects the excessive defects on a wafer over an allowable level, the operator should specify the specific portion (the cause portion) of the processing system, which is a cause of the defects, and take measures of how to prevent defects from occurring.

In this case, the operator compares the defect distribution pattern, obtained by the measurement, with the characteristic configuration of the specific portion of the processing system with the naked eyes (visually), and then specifies the cause portion. Specifically, the operator compares the characteristic configuration of each of the various components of the processing system, which is based on a design drawing or the memory of the operator, for example, the arrangement configuration of gas spray holes of a shower head included in each processing chamber, with the defect distribution pattern of the surface of a wafer. Thereafter, the operator specifies the cause portion which has caused the defects by finding a component such as the shower head having the configuration that is most coincident with the defect distribution pattern.

Further, devices for inspecting defects on a semiconductor wafer have made startling progress recently. Therefore, defects, including not only foreign materials such as particles attached on a wafer but also a scratch on the wafer and short circuit or disconnection of a wiring line, can be detected and monitored at a high speed.

However, when specifying a cause portion which has caused the defects, the operator should compare the characteristic configuration of the specific portion of the processing system with the defect distribution pattern of a wafer with the naked eyes. Therefore, the accuracy of the comparative determination is influenced by the knowledge or experience of the operator regarding components. Further, it is difficult to quantitatively obtain the degree of coincidence between the characteristic configuration and the defect distribution pattern.

Further, since the defect distribution pattern should be compared with a plurality of reference patterns with the naked eyes, a long time is required to specify a cause portion which has caused the defects.

Meanwhile, as disclosed in Japanese Patent Laid-open Publication No. 2005-236094, a device which has caused inferiority may be specified by performing probe inspection after completing products such as integrated circuits (ICs), and comparing a probe inspection map with a defect map. This enables to specify the processing unit which has caused inferiority to the products. In this technology, the cause of inferiority is specified through the inspection after products are completed. Therefore, the same cause of inferiority affects a number of wafers which are processed before the inspection is performed, so that a number of defective and wasteful wafers may occur.

SUMMARY OF THE INVENTION

The present invention has been made keeping in mind the above problems to effectively solve the problems.

The present invention provides a method and system for comparing a characteristic configuration of a specific portion of a processing system, which comes into contact with or approaches an object, with a defect distribution pattern occurring on the surface of the object to rapidly and quantitatively obtain the degree of coincidence between the configuration and the defect distribution pattern.

In accordance with a first aspect of the present invention, there is provided a comparison method for a defect distribution pattern occurring on a surface of an object processed by a processing system, the method including: previously storing a reference pattern indicating a characteristic configuration of a specific portion of the processing system, which comes into contact with or approaches the object; inspecting the object processed by the processing system to obtain the defect distribution pattern occurring on the surface of the object; comparing the reference pattern with the defect distribution pattern; and obtaining a degree of coincidence between the two patterns based on the comparison.

The comparison method preferably further includes determining that there is a high or low possibility that the specific portion of the processing system corresponding to the reference pattern has caused the defects in case the degree of coincidence is equal to or higher than or is lower than a specific reference value.

The processing system may include a plurality of processing apparatuses, each of the processing apparatuses including a processing chamber for accommodating the object therein, and a shower head having a plurality of gas spray holes for supplying a gas into the processing chamber, and a characteristic arrangement pattern of the gas spray holes of each of the processing apparatuses may be used as the reference pattern.

Further, the processing system may include a plurality of processing apparatuses, each of the processing apparatuses including a processing chamber for accommodating the object therein, a mounting table provided in the processing chamber, and a plurality of lift pins configured to be lifted toward the mounting table to support a back side of the object, and a characteristic arrangement pattern of the lift pins of each of the processing apparatuses may be used as the reference pattern.

Moreover, the processing system may include a plurality of transfer arms for transferring the object, each of the transfer arms including a plurality of pads for supporting a back side of the object, and a characteristic arrangement pattern of the pads of each of the transfer arms may be used as the reference pattern.

In the first aspect, there is further provided a comparison method for a defect distribution pattern occurring on a surface of an object processed by a processing system using a plurality of cassette containers each including a plurality of support shelves for supporting a back side of the object, the method including: previously storing a reference pattern indicating a characteristic configuration of the support shelves of each of the cassette containers; inspecting the object processed by the processing system to obtain the defect distribution pattern occurring on the surface of the object; comparing the reference pattern with the defect distribution pattern; and obtaining a degree of coincidence between the two patterns based on the comparison.

In accordance with a second aspect of the present invention, there is provided a comparison system for a defect distribution pattern occurring on a surface of an object processed by a processing system, the comparison system including: a reference pattern storage unit for previously storing a reference pattern indicating a characteristic configuration of a specific portion of the processing system, which comes into contact with or approaches the object; a defect inspection unit for inspecting the object processed by the processing system to obtain the defect distribution pattern occurring on the surface of the object; a pattern comparison unit for comparing the defect distribution pattern obtained by the defect inspection unit with the reference pattern stored in the storage unit; and a comparison result processing unit for obtaining a degree of coincidence between the two patterns based on the comparison performed by the pattern comparison unit.

In the comparison system, in case the obtained degree of coincidence is equal to or higher than or is lower than a specific reference value, the comparison result processing unit preferably determines that there is a high or low possibility that the specific portion of the processing system corresponding to the reference pattern has caused the defects.

With the defect distribution pattern comparison method and system in accordance with the present invention, excellent advantages can be obtained as follows. By comparing a defect distribution pattern obtained by inspection with the previously stored (recorded) reference pattern indicating characteristic configuration, the degree of coincidence between the two patterns can be quickly and quantitatively obtained. Therefore, the accurate degree of coincidence can be obtained regardless of the experience or knowledge of an operator. Further, the specific portion or the cassette container of the processing system corresponding to a cause portion which has caused the defects can be exactly specified in a short period of time. Further, by comparing the defect distribution pattern with each of a plurality of reference patterns to obtain the degree of coincidence therebetween, it is possible to effectively determine the priority of maintenance executed to remove the cause of the defects.

BRIEF DESCRIPTION OF THE DRAWINGS

FIG. 9 is a view showing an example of results of the determination of degrees of coincidence and possibilities for respective reference patterns.

DETAILED DESCRIPTION OF THE EMBODIMENTS

Hereinafter, a defect distribution pattern comparison method and system in accordance with an embodiment of the present invention will be described in detail with reference to the accompanying drawings.

Figure 1:
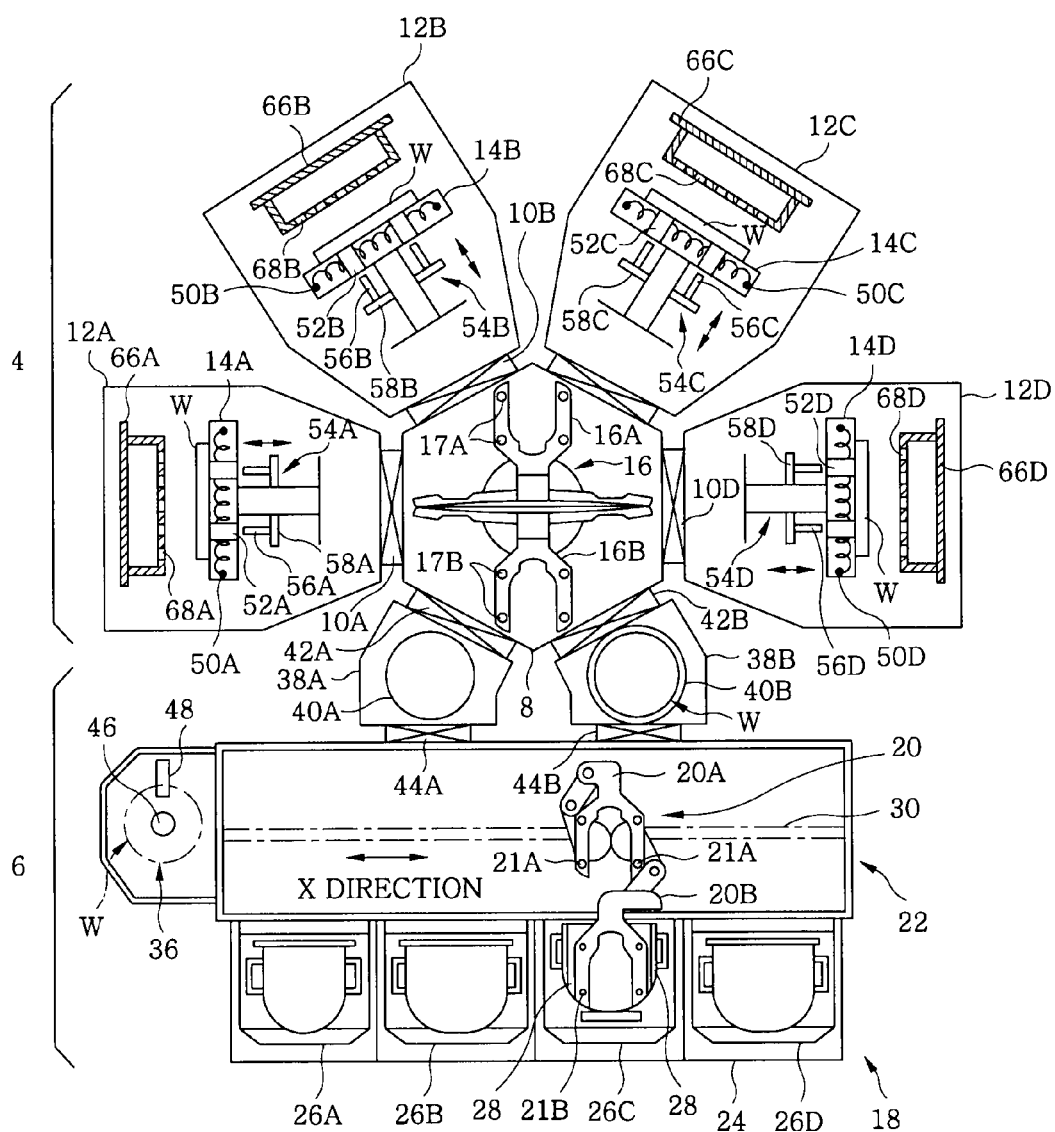
FIG. 1 is a schematic diagram showing an example of a processing system to which a defect distribution pattern comparison method in accordance with the present invention is applied.

First, with reference to FIG. 1, there will be described a cluster tool-type processing system which is an example of a manufacturing line. Further, FIG. 1 schematically shows the inside configuration of each processing chamber. The processing system 2 includes a processing unit 4 having four processing apparatuses, and a transfer unit 6 for transferring a wafer W into and from the processing unit 4. The processing unit 4 is configured to performs various processes, such as a film forming process, diffusion process and an etching process, on a semiconductor wafer (a substrate) W to be processed by using the processing apparatuses.

The processing unit 4 includes an evacuable common transfer chamber 8 and four processing apparatuses. The processing apparatuses include processing chambers 12A to 12D connected to the transfer chamber 8 through gate valves 10A to 10D, respectively. In each of the processing chambers 12A to 12D, the same or different processes are performed on the wafer W. The processing chambers 12A to 12D are provided with respective mounting tables 14A to 14D for mounting the wafer W thereon. Further, in the common transfer chamber 8, there is provided a first transfer mechanism 16 configured to be extensible, contractible and rotatable. The first transfer mechanism 16 is configured to transfer the wafer W to and from the chambers 12A to 12D and load lock chambers which will be described later.

Here, the first transfer mechanism 16 includes two transfer arms 16A and 16B. The transfer arms 16A and 16B are respectively provided with two sets of four pads 17A and 17B on the upper surfaces thereof, each set of the four pads 17A and 17B being configured to support the back side of the wafer W. Each set of the pads 17A and 17B is configured to support the wafer W in such a way that the back side of the wafer W comes into contact with the upper portions of the pads.

The transfer unit 6 includes a cassette stage 18 for receiving cassette containers, and a transfer stage 22 having a second transfer mechanism 20 for transferring the wafer W. The cassette stage 18 includes a container support table 24 capable of receiving four cassette containers 26A to 26D. Each of the cassette containers 26A to 26D is provided with 25 support shelves 28 for supporting the outer periphery of the back side of the wafer W, the support shelves 28 being arranged at regular intervals vertically.

The transfer stage 22 is provided with a guide rail 30 extended longitudinally (in the X direction). The second transfer mechanism 20 is supported by the guide rail 30 slidably. As a driving mechanism for moving the second transfer mechanism 20 along the guide rail 30, for example, a ball screw (not shown) is installed parallel to the guide rail 30. The second transfer mechanism 20 includes two transfer arms 20A and 20B. The transfer arms 20A and 20B are respectively provided with two sets of four pads 21A and 21B on the upper surfaces thereof, each set of the four pads 21A and 21B being configured to support the back side of the wafer W. Each set of the pads 21A and 21B is configured to support the wafer W in such a way that the back side of the wafer W comes into contact with the upper portions of the pads.

Further, an orienter 36 functioning as a mechanism for positioning a wafer W is provided at one end of the transfer stage 22. Two evacuable load lock chambers 38A and 38B are provided on the opposite side of the transfer stage 22 to the cassette stage 18 in order to connect the transfer stage 22 to the common transfer chamber 8. The load lock chambers 38A and 38B are provided with respective substrate mounting tables 40A and 40B for mounting the wafer W thereon. Gate valves 42A and 42B are provided between the respective load lock chambers 38A and 38B and the common transfer chamber 8, and gate valves 44A and 44B are provided between the respective load lock chambers 38A and 38B and the transfer stage 22.

The orienter 36 includes a rotation shaft 46 to be rotated in the state in which the wafer W is loaded thereon. The outer circumference of the rotation shaft 46 is provided with an optical sensor unit 48 for detecting the peripheral edge portion of the wafer W. By irradiating light to one end of the wafer to detect variation of the light, cut-outs or notches formed in the wafer W can be detected.

Figure 2:
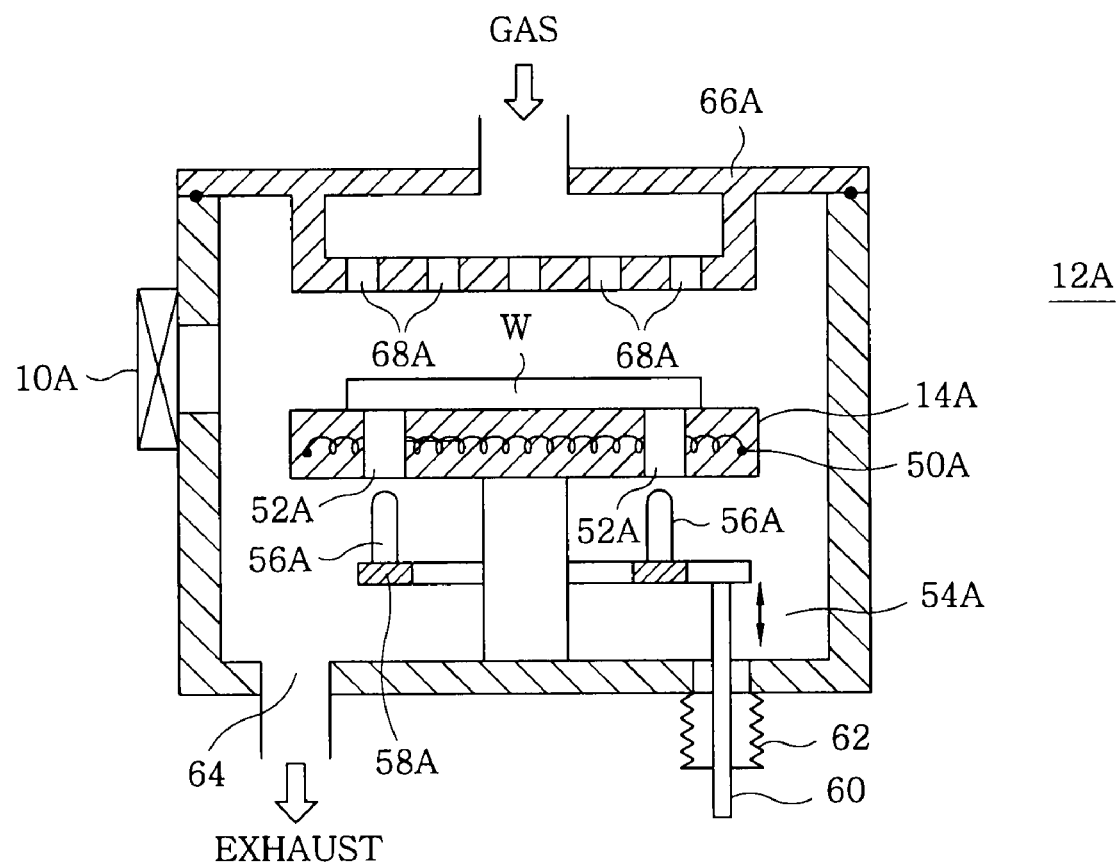
FIG. 2 shows a schematic view of one of processing apparatuses provided in the processing system shown in FIG. 1.

Next, with reference to FIGS. 1 and 2, the configuration of each of the processing apparatuses (each of the processing chambers 12A to 12D and the inside thereof) will be described. Here, for easy understanding of the present invention, except for arrangement patterns of gas spray holes of a shower head which will be described later, the basic configurations of the respective processing chambers 12A to 12D and the insides thereof are set to be identical to each other. Here, in FIG. 2, the single processing chamber 12A is described as a representative example.

First, the gate valves 10A to 10D are provided on the side walls of the processing chambers 12A to 12D, respectively. The mounting tables 14A to 14D, provided in the respective processing chambers 12A to 12D, are provided with respective heaters 50A to 50D such as resistance heaters. The mounting tables 14A to 14D are formed with plural sets of pin holes 52A to 52D, respectively. Further, the lifter pin mechanisms 54A to 54D are provided correspondingly to the respective mounting tables 14A to 14D.

Figure 4:
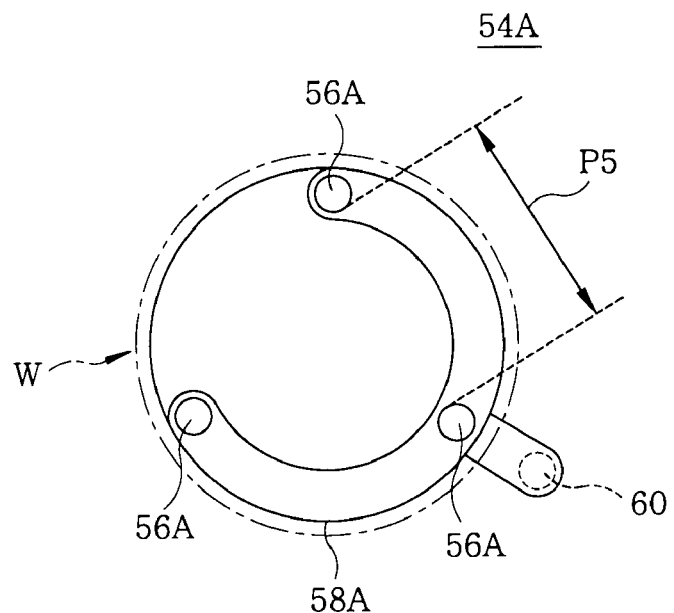
FIG. 4 is a plane view showing arrangement pattern of lift pins of the processing apparatus of FIG. 2.

The lifter pin mechanisms 54A to 54D include plural sets of lift pins 56A to 56D corresponding to the pin holes 52A to 52D in the mounting tables, respectively. The base portions of the lift pins 56A to 56D are respectively connected to circular-arc-shaped pin holding boards 58A to 58D, as shown in FIG. 4. Further, each of the pin holding boards 58A to 58D is connected to a vertically movable rod 60 (see FIG. 2) extending through the bottom portion of the corresponding processing chamber 12A, 12B, 12C or 12D. Therefore, each of the lift pins 56A to 56D is configured to be moved up and down with respect to the corresponding mounting table 14A, 14B, 14C or 14D, and to support the back side of the wafer W when it is moved up. Further, at a portion of the processing chamber through which the vertically movable rod 60 extends, there is provided a bellows 62 configured to allow the vertically movable rod 60 to be moved up and down while maintaining airtightness in the chamber, as shown in FIG. 2.

A gas exhaust opening 64 (see FIG. 2) is provided on the bottom portion of each of the processing chambers 12A to 12D. Each of the processing apparatuses includes a gas exhaust system (not shown) for exhausting the atmosphere in the corresponding processing chamber 12A, 12B, 12C or 12D through the gas exhaust opening 64. The upper portion of each of the processing chambers 12A to 12D is provided with a shower head 66A, 66B, 66C or 66D, having a plurality of gas spray holes 68A, 68B, 68C or 68D through which a gas is supplied into the processing chamber. The gas spray holes 68A, 68B, 68C or 68D are formed in the bottom of the corresponding shower head 66A, 66B, 66C or 66D located closer to the corresponding mounting table 14A, 14B, 14C or 14D while facing it.

The gas spray holes 68A to 68D of the respective shower heads 66A to 66D have characteristic arrangement patterns which are different from each other. Therefore, each of the shower heads can be specified by the arrangement patterns of the gas spray holes 68A to 68D. For example, the arrangement patterns of the gas spray holes 68A to 68D of the respective shower heads 66A to 66D are respectively set as shown in FIGS. 3A to 3D.

Figure 3A:
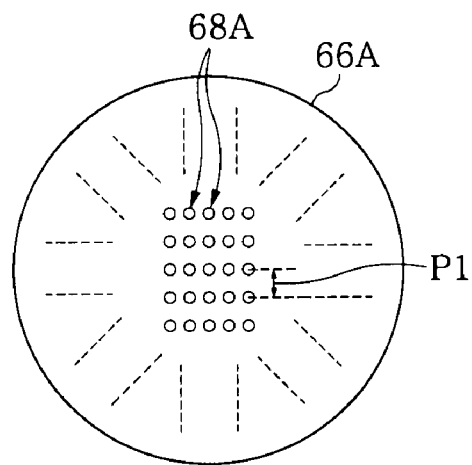
FIGS. 3A to 3D are bottom views showing arrangement patterns A to D of gas spray holes of a shower head of the processing apparatus shown in FIG. 2.
Figure 3B:
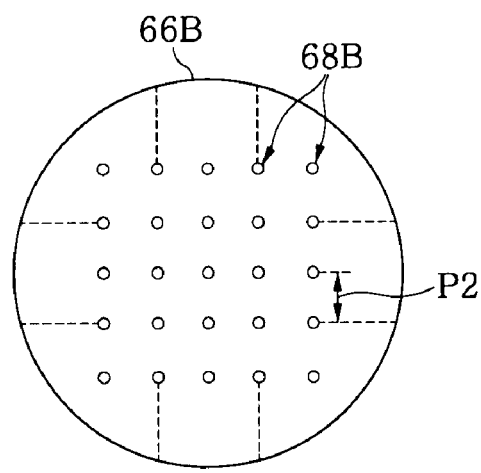
Figure 3C:
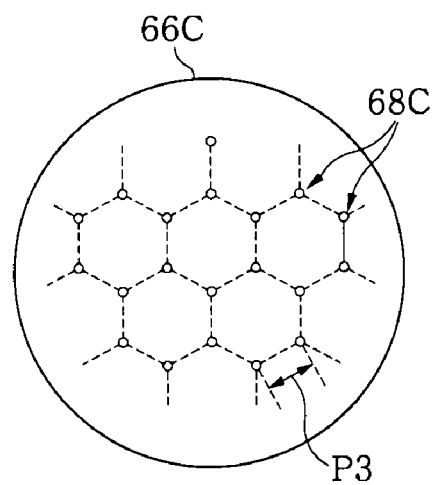
Figure 3D:
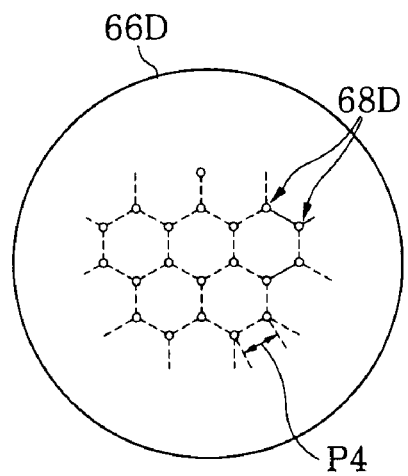

Although both the arrangement patterns shown in FIGS. 3A and 3B have grid shapes, setting is made such that a pitch P1 between two adjacent spray holes 68A shown in FIG. 3A is narrower than a pitch P2 between two adjacent spray holes 68B shown in FIG. 3B. Although both the arrangement patterns of the spray holes 68C and 68D shown in FIGS. 3C and 3D have honeycomb shapes, setting is made such that a pitch P4 between two adjacent spray holes 68A shown in FIG. 3D is narrower than a pitch P3 between two adjacent spray holes 68C shown in FIG. 3C.

Further, the lift pins 56A to 56D of the respective processing chambers 12A to 12D have characteristic arrangement patterns which are different from each other. For example, with regard to the lift pins 56A to 56D, pitches P5 between two adjacent lift pins are slightly different from each other (the pitch P5 between two adjacent lift pins 56A is representatively shown in FIG. 4).

Figure 5:
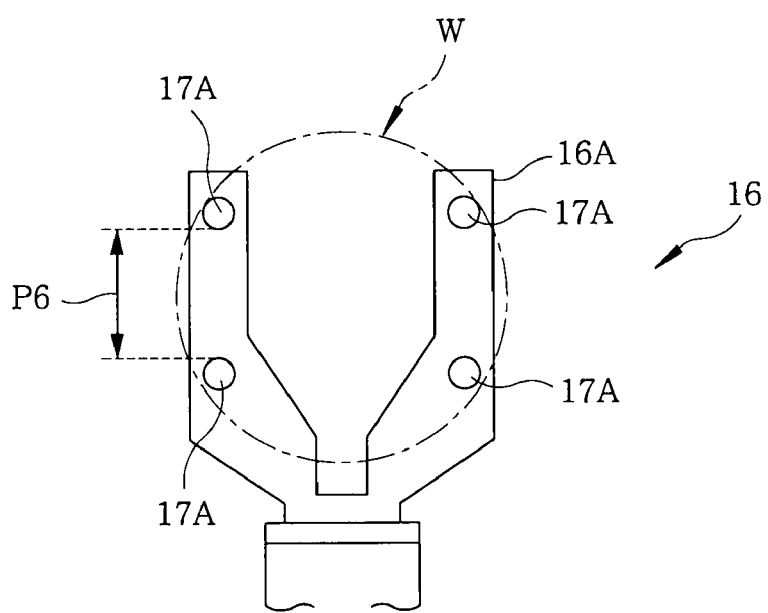
FIG. 5 is a plane view showing a transfer arm provided in the processing system shown in FIG. 1.

Furthermore, The pads 17A, 17B, 21A, and 21B of the respective transfer arms 16A, 16B, 20A, and 20B have characteristic arrangement patterns which are different from each other. For example, with regard to the transfer arms 16A, 16B, 20A, and 20B, the pitches P6 between two adjacent pads are slightly different from each other (the pitch P6 between two adjacent pads 17A is representatively shown in FIG. 5).

Hereinafter, based on the configuration of the processing system 2, a defect distribution pattern comparison system in accordance with the present invention will be described.

Figure 6:
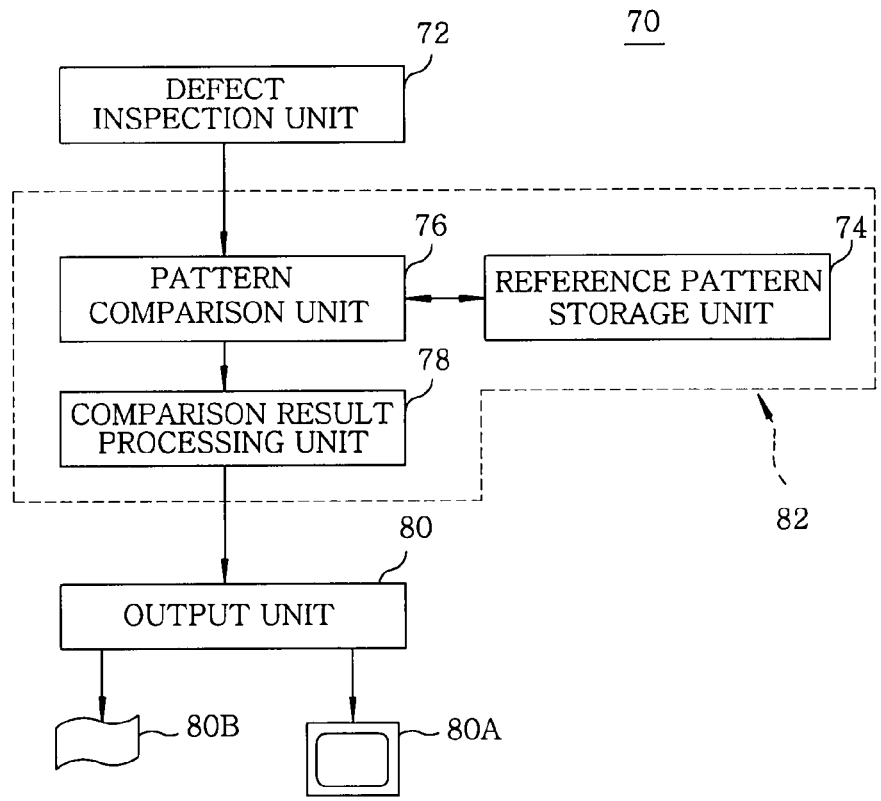
FIG. 6 is a block diagram showing an embodiment of a defect distribution pattern comparison system in accordance with the present invention.

A defect distribution pattern comparison system 70, shown in FIG. 6, includes a defect inspection unit 72, a reference pattern storage unit 74, a pattern comparison unit 76, a comparison result processing unit 78, and an output unit 80. The inspection unit 72 inspects a wafer W processed by the processing system 2, and obtains a defect distribution pattern occurring on the surface of the wafer W. The storage unit 74 previously stores reference patterns indicating the characteristic configurations of the specific portions of the processing system 2 which come into contact with or approach the wafer W. The comparison unit 76 compares the defect distribution pattern obtained by the inspection unit 72 with each of the reference patterns stored in the storage unit 74. The comparison result processing unit 78 obtains the degree of coincidence between each reference pattern and the defect distribution pattern based on the comparison performed by the comparison unit 76. The output unit 80 outputs data such as the obtained degree of coincidence.

Further, the storage unit 74, the comparison unit 76, and the comparison result processing unit 78 can be constituted by a computer 82 for processing the functions thereof using software. With regard to the computer 82, any type of computers, for example, a computer for controlling the entire processing system 2, a dedicated computer and a general computer, can be used. The defect inspection unit 72 is a device for obtaining the defect distribution pattern by detecting defects occurring on the surface of the wafer W and mapping the defects, and a well-known defect measurement device can be used as the defect inspection unit 72.

The reference patterns, previously stored in the storage unit 74, may include the arrangement patterns of the gas spray holes 68A to 68D of the respective shower heads 66A to 66D (FIG. 3); the arrangement patterns of the lift pins 56A to 56D of the respective lifter pin mechanisms 54A to 54D (FIG. 4); the arrangement patterns of the pads 17A, 17B, 21A, and 21B of the respective transfer arms 16A, 16B, 20A, and 20B (FIG. 5); and the patterns of the characteristic configurations of the support shelves 28 of the respective cassette containers 26A to 26D.

The reference patterns are put into a database and stored in the storage unit 74. Further, the storage unit 74 is set in such a way that deletion, addition, and variation of stored content thereof can be performed based on the replacement or repair of components, the increase and decrease in the number of processing apparatuses, or variation in the cassette containers in the processing system 2.

Based on the comparison between each of the reference patterns and the defect distribution pattern performed by the comparison unit 76, the comparison result processing unit 78 obtains the degree of coincidence between the two patterns for each reference pattern. The comparison result processing unit 78 quantitatively obtains the degree of coincidence, for example, in percentages, using well-known image recognition software or pattern comparison software. Further, in case the degree of coincidence is equal to or higher than or is lower than a predetermined reference value, the comparison result processing unit 78 determines that there is a high or low possibility that the specific portion (or the support shelf of a specific cassette container) of the processing system, which corresponds to the relevant reference pattern, is a cause portion which has caused the defects. For example, when the predetermined reference value is set to 50%, in case the degree of coincidence is equal to or higher than 50%, it is determined that "there is a high possibility that the specific portion of the processing system has caused the defects (NG)". On the other hand, if the degree of coincidence is lower than 50%, it is determined that "there is a low possibility that the specific portion of the processing system has caused the defects (OK)". The predetermined reference value can be variously set by an operator.

The output unit 80 outputs the degree of coincidence obtained by the comparison result processing unit 78 or data including the determination results to, e.g., a display 80A or a printer 80B. The operator determines whether to perform maintenance for the relevant component based on the output data.

Next, there will be described a defect distribution pattern comparison method, which is performed by using the comparison system 70 configured as described above.

First, each process to be performed on a semiconductor wafer W by using the processing system 2, shown in FIGS. 1 and 2, will be described. Here, for easy understanding of the present invention, it is assumed that various processes are sequentially performed on a wafer at the respective processing chambers 12A to 12D.

In FIG. 1, a manufacturing line includes a reciprocation transfer line between the cassette stage 18 for receiving the cassette containers 26A to 26D and the respective processing chambers 12A to 12D. First, an unprocessed semiconductor wafer W is unloaded from a specific cassette container, e.g., the cassette container 26C, of the cassette stage 18, by any one of transfer arms of the second transfer mechanism 20, e.g., the transfer arm 20B. The wafer W is transferred to the orienter 36, provided at one end of the transfer stage 22, and then the positioning thereof is performed. The positioned wafer W is held by one of the transfer arms of the second transfer mechanism 20 again, and then transferred into one of the two load lock chambers 40A and 40B.

After the pressure of the relevant load lock chamber is adjusted, the wafer W is transferred by any one of the two transfer arms 16A and 16B of the first transfer mechanism 16 from the load lock chamber into any one of the processing chambers, e.g., the processing chamber 12A. The wafer W is supported by the lift pins 56A lifted up and loaded on the mounting table 14A in the processing chamber 12A. Thereafter, the inside of the processing chamber 12A is airtightly sealed, and specific processing gas is sprayed through the gas spray holes 68A of the shower head 66A, so that the inside of the processing chamber 12A is maintained at a specific processing pressure and temperature. Thereafter, a specific process, for example, a film forming process, is performed on the wafer W.

Then, when the process in the processing chamber 12A is completed, the corresponding wafer W is sequentially transferred into the other processing chambers 12B to 12D by using the first transfer mechanism 16, and desired processes are performed on the wafer W in the respective processing chambers 12B to 12D. Further, when a series of the processes have been completed, the processed wafer W is transferred back to the original cassette container 26C along the reverse path to be received in the original cassette container 26C. (At this time, however, the wafer does not need to pass through the orienter 36). Thereafter, all of the prepared wafers W are processed in the same manner.

Here, the processed wafer W is required to be inspected in order to determine whether there are defects on the surface thereof. If excessive defects over an allowable level exist, it is required to specify the cause portion which has caused the defects and then to perform maintenance work therefor. Therefore, the defect distribution pattern comparison method in accordance with the present invention is performed by using the comparison system 70 shown in FIG. 6.

The comparison method will be described with reference to FIGS. 6 to 9.

Figure 7:
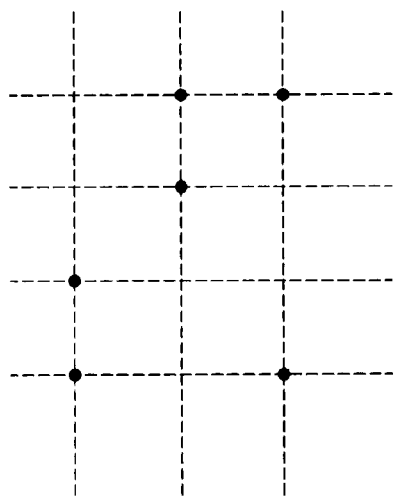
FIG. 7 is a plan view showing an example of a defect distribution pattern obtained by a defect inspection unit of the system shown in FIG. 6.
Figure 8:
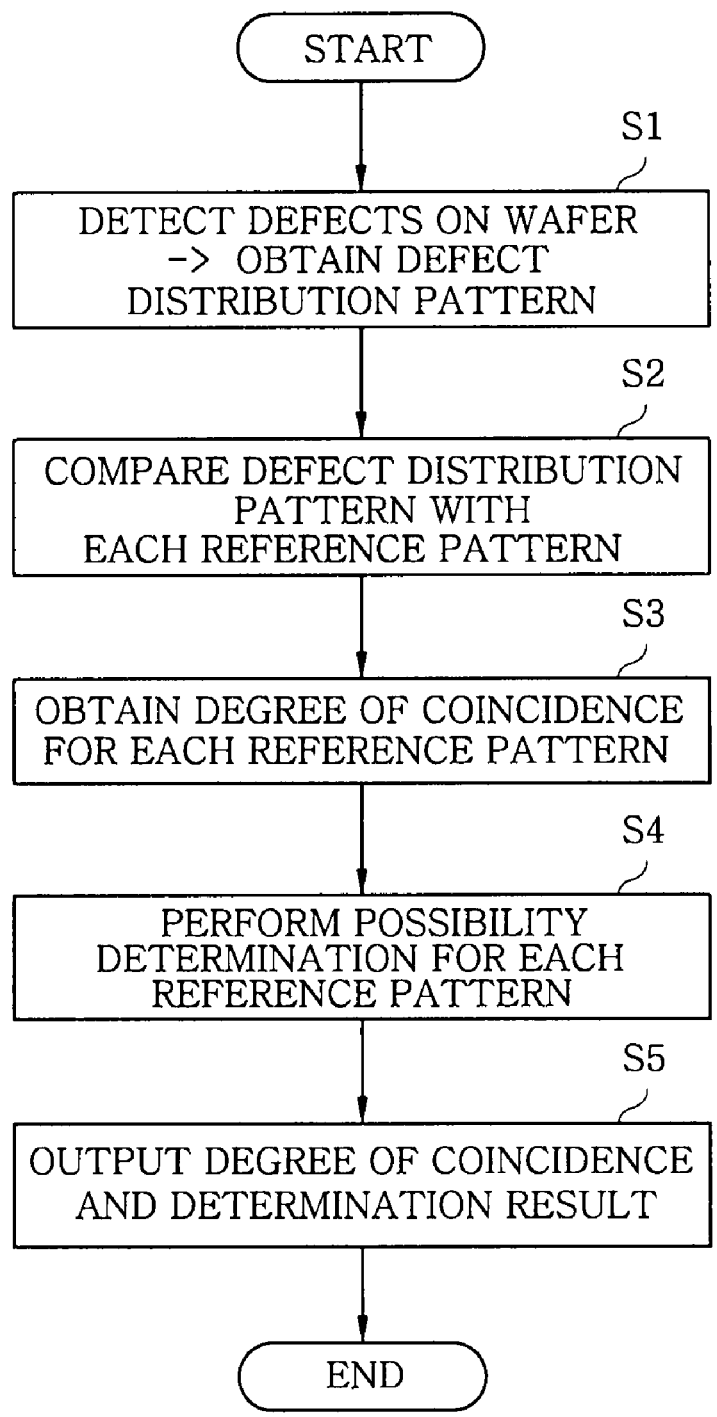
FIG. 8 is a flowchart showing a defect distribution pattern comparison method performed by the system shown in FIG. 6.

First, the defect inspection unit 72 shown in FIG. 6 inspects each of the processed wafers W, detects defects on the surface of the relevant wafer W which are greater than a predetermined size, and then maps the defects, thereby obtaining a defect distribution pattern (step S1 of FIG. 8). FIG. 7 is a view showing an example of the obtained defect distribution pattern, in which defects are scattered in the form of dots.

Thereafter, the defect distribution pattern obtained by the inspection unit 72 is transmitted to the pattern comparison unit 76 as data. The comparison unit 76 compares the received defect distribution pattern with each of the reference patterns previously stored in the storage unit 74 (step S2 of FIG. 8). The comparison is performed by matching the coordinates of both patterns.

Then, the comparison result processing unit 78 obtains the degrees of coincidence between each of the reference patterns and the defect distribution pattern based on the comparison performed by the comparison unit 76 (step S3 of FIG. 8). The degrees of coincidence are obtained for example in percentages, as shown in FIG. 9. The degree of coincidence of 100% indicates that the two patterns completely coincide with each other while the degree of coincidence of 0% indicates that the two patterns do not coincide with each other at all. Further, the comparison result processing unit 78 performs possibility determination for each of the reference patterns based on a preset determination reference value of the degree of coincidence (step S4 of FIG. 8). In particular, in case the determination reference value for the degree of coincidence is set to 50%, if the degree of coincidence is equal to or higher than 50%, it is determined that "there is a high possibility that the portion has caused the defects (NG)", while, if the degree of coincidence is lower than 50%, it is determined that "there is a low possibility that the portion has caused the defects (OK) ", as shown in FIG. 9.

Further, the output unit 80 outputs the degrees of coincidence and determination results obtained by the comparison result processing unit 78, e.g., in a form shown in FIG. 9 (step S5 of FIG. 8). The output form may be arbitrarily changed, and the output may be made by, for example, displaying images on the display 80A or printing out the images on a paper by using the printer 80B.

For example, as shown in FIG. 9, the display of the degree of coincidence (%) and the possibility determination ("NG" or "OK") is realized, and reference patterns are displayed in order of high degree of coincidence. In FIG. 9, with regard to the degree of coincidence, the degree of coincidence of the arrangement pattern of the gas spray holes 68B of the shower head 66B is the highest, that is, 90%, and the next is the arrangement pattern of the gas spray holes 68A of the shower head 66A, that is, 60%. The degree of coincidence is gradually decreased in such a way that the degree of coincidence of the arrangement pattern of the gas spray holes 68C of the shower head 66C is 30%, and the degree of coincidence of the arrangement pattern of the gas spray holes 68D of the shower head 66D is 20%.

For example, the defect distribution pattern shown in FIG. 7 is very similar to a part of the arrangement pattern of the gas spray holes 68B of the shower head 66B shown in FIG. 3B (the degree of coincidence therebetween is high). Therefore, it is determined that there is a high possibility that the gas spray holes 68B have caused the defects (for example, particles) (NG). Here, with reference to the results shown in FIG. 9, an operator can perform maintenance work, such as cleaning, repair, or replacement, in order of high degree of coincidence or only for the component(s) of which the possibility determination is corresponding to "NG".

Further, there is a possibility that the lift pins, the pads of the each of the transfer arms, and the support shelves of each of the cassette containers cause defects on the corresponding parts of the surface of the wafer due to the affects of particles generated when they come into contact with the edge portions of the back side of the wafer. Therefore, with respect to such components, it is also possible to specify as a cause portion which has caused the defects based on the defect distribution pattern of the surface of the wafer.

As described above, the pattern comparison unit 76 of the computer 82 compares each of the reference patterns, which are previously stored (recorded) and indicate characteristic configurations, with a defect distribution pattern obtained by inspection, so that each of the degrees of coincidence between the two patterns can be quickly and quantitatively obtained.

Therefore, regardless of the experience or knowledge of an operator, not only can the degree of coincidence be obtained to a high degree of accuracy but also the specific portion or cassette container of the processing system, which becomes a cause portion which has caused the defects, can be exactly specified within a short period of time. Further, with regard to the plurality of reference patterns, each of them is compared with a defect distribution pattern to obtain the degree of coincidence therebetween, and the reference patterns are displayed in order of high degree of coincidence by the output unit 80, thereby effectively determining the priority of maintenance performed so as to remove the cause of the defects.

Further, in the embodiment, for easy understanding of the present invention, there has been described in the premise that the reference patterns are different from each other. However, the reference patterns may include identical patterns. In this case, it is apparent that the identical reference patterns have a same degree of coincidence and a same possibility determination.

Further, although there has been described the case where the configurations of the processing apparatuses including the respective processing chambers 12A to 12D are approximately the same, the present invention is not limited thereto. For example, the processing apparatuses may be configured to perform respective processes which are different from each other, for example, a film forming process, an etching process, an oxidation/diffusion process, a modification process, and an annealing process. In this case, the processing apparatuses may not have a shower head depending on the type of processing. Further, the present invention is not limited to the above-described components, such as the shower head. As long as a part or a component would cause the defects, an arrangement pattern showing the characteristic configuration thereof may be used as a reference pattern of the present invention.

Further, although the single processing system 2 shown in FIG. 1 has been used for the comparison, the present invention is not limited thereto. For example, the present invention may be applied to any processing system of manufacturing line for pre-processing or post-processing, which is different from the corresponding processing system 2. Further, with regard to defect distribution pattern data, defects such as "attachment of foreign materials" and "short-circuit of wiring pattern" may be classified based on categories so that a defect pattern is compared with each of categorized reference patterns. In this case, the category "attachment of foreign materials" may be divided into subcategories including such as "attachment of organic particles".

Further, although the semiconductor wafer has been described as an example of a target object, the present invention is not limited thereto. The present invention may be applied to a glass substrate, a liquid crystal display (LCD) substrate, and a ceramic substrate.

What is claimed is:

1. A comparison method for a defect distribution pattern occurring on a surface of an object processed by a processing system, the method comprising:
   previously storing a reference pattern indicating a characteristic configuration of a specific portion of the processing system, which comes into contact with or approaches the object;
   inspecting the object processed by the processing system to obtain the defect distribution pattern occurring on the surface of the object;
   comparing the reference pattern with the defect distribution pattern; and obtaining a degree of coincidence between the two patterns based on the comparison.

2. The method of claim 1, further comprising determining that there is a high or low possibility that the specific portion of the processing system corresponding to the reference pattern has caused the defects in case the obtained degree of coincidence is equal to or higher than or is lower than a specific reference value.

3. The method of claim 1, wherein the processing system comprises a plurality of processing apparatuses, each of the processing apparatuses including a processing chamber for accommodating the object therein, and a shower head having a plurality of gas spray holes for supplying a gas into the processing chamber, and a characteristic arrangement pattern of the gas spray holes of each of the processing apparatuses is used as the reference pattern.

4. The method of claim 1, wherein the processing system comprises a plurality of processing apparatuses, each of the processing apparatuses including a processing chamber for accommodating the object therein, a mounting table provided in the processing chamber, and a plurality of lift pins configured to be lifted toward the mounting table to support a back side of the object, and a characteristic arrangement pattern of the lift pins of each of the processing apparatuses is used as the reference pattern.

5. The method of claim 1, wherein the processing system comprises a plurality of transfer arms for transferring the object, each of the transfer arms including a plurality of pads for supporting a back side of the object, and a characteristic arrangement pattern of the pads of each of the transfer arms is used as the reference pattern.

6. A comparison method for a defect distribution pattern occurring on a surface of an object processed by a processing system using a plurality of cassette containers each including a plurality of support shelves for supporting a back side of the object, the method comprising:

previously storing a reference pattern indicating a characteristic configuration of the support shelves of each of the cassette containers;

inspecting the object processed by the processing system to obtain the defect distribution pattern occurring on the surface of the object;

comparing the reference pattern with the defect distribution pattern; and obtaining a degree of coincidence between the two patterns based on the comparison.

7. A comparison system for a defect distribution pattern occurring on a surface of an object processed by a processing system, the comparison system comprising:

a reference pattern storage unit for previously storing a reference pattern indicating a characteristic configuration of a specific portion of the processing system, which comes into contact with or approaches the object;

a defect inspection unit for inspecting the object processed by the processing system to obtain the defect distribution pattern occurring on the surface of the object;

a pattern comparison unit for comparing the defect distribution pattern obtained by the defect inspection unit with the reference pattern stored in the storage unit; and a comparison result processing unit for obtaining a degree of coincidence between the two patterns based on the comparison performed by the pattern comparison unit.

8. The comparison system of claim 7, wherein, in case the obtained degree of coincidence is equal to or higher than or is lower than a specific reference value, the comparison result processing unit determines that there is a high or low possibility that the specific portion of the processing system corresponding to the reference pattern has caused the defects.

\* \* \* \* \*